United States Patent [19]

Ebihara et al.

[11] Patent Number: 5,021,733
[45] Date of Patent: Jun. 4, 1991

[54] BURN-IN APPARATUS

[75] Inventors: Sachiko Ebihara; Yasuhiko Fukushima, both of Itami, Japan

[73] Assignee: Mitsubishi Denki Kabushiki Kaisha, Japan

[21] Appl. No.: 463,544

[22] Filed: Jan. 11, 1990

[30] Foreign Application Priority Data

Nov. 2, 1989 [JP] Japan .................. 1-284853

[51] Int. Cl.[5] .......................... G01R 1/00; G01R 1/02
[52] U.S. Cl. ........................... 324/158 F; 324/158 P; 324/158 R
[58] Field of Search ............... 324/72.5, 158 R, 15 C, 324/158 P, 158 F; 437/8; 219/385

[56] References Cited

U.S. PATENT DOCUMENTS

| 3,710,251 | 1/1973 | Hagge et al. | 324/158 F |
| 4,713,611 | 12/1987 | Solstad et al. | 324/158 F |
| 4,799,021 | 1/1989 | Cozzi | 324/158 R |

FOREIGN PATENT DOCUMENTS

| 3031137 | 3/1982 | France | 324/158 F |
| 3229448 | 2/1984 | France | 324/158 F |
| 0069568 | 6/1981 | Japan | 324/158 F |
| 62-51279 | 3/1987 | Japan | |
| 0175785 | 7/1988 | Japan | 324/158 P |
| 0172772 | 7/1989 | Japan | 324/158 F |

OTHER PUBLICATIONS

"Carrier Card Assembly for Component Aging", by Bruder et al., IBM Tech. Disc. Bull., vol. 14, #3 8/71; p. 737.

"Novel Variable-Temperature Chuck for Use in the Detection of Deep Levels in Processed Semiconductor Wafers", by Koyamo et al.; Rev. Sci. Instrum., Am. Insti. of Phys., 8/79, pp. 983–987, vol. 50, #8.

Primary Examiner—Kenneth Wieder
Assistant Examiner—William J. Burns
Attorney, Agent, or Firm—Leydig, Voit & Mayer

[57] ABSTRACT

A burn-in apparatus includes burn-in boards for holding semiconductor devices through air suction and for electrically connecting them to external equipment. Since the semiconductor devices are held on the burn-in boards for electrical connection through air suction, sockets are not necessary to hold them on the boards which reduces costs. Further, the leads of semiconductor devices, which have conventionally been susceptible to bending when inserted into or extracted from the sockets, can be protected.

7 Claims, 7 Drawing Sheets

FIG. I
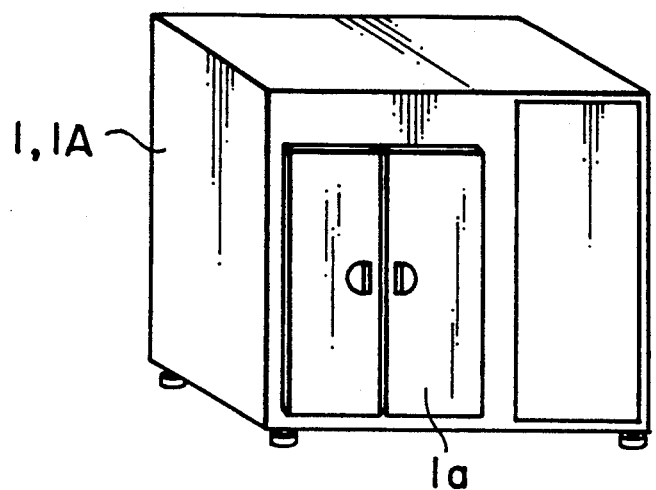
FIG. 2
PRIOR ART
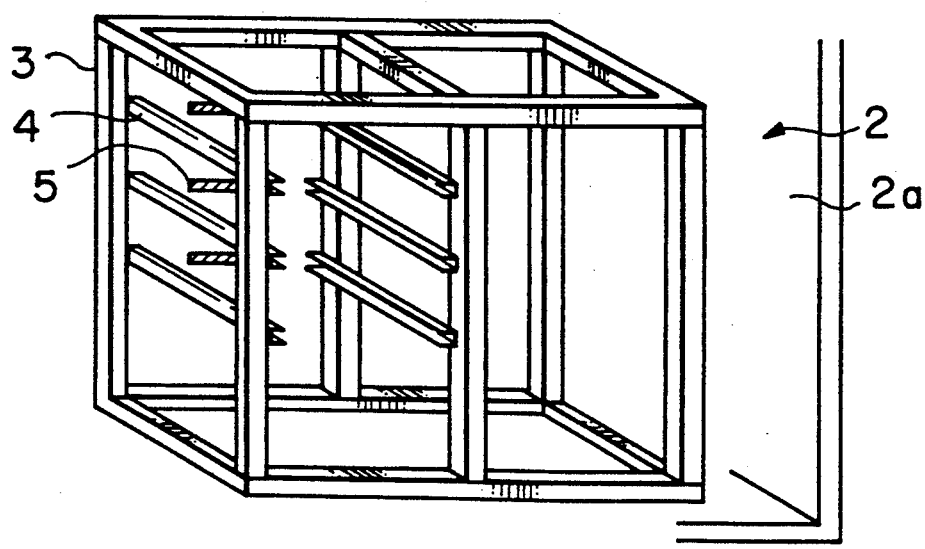

BURN-IN APPARATUS

BACKGROUND OF THE INVENTION

1. Field of the Invention

This invention relates to a burn-in apparatus, and, in particular, to a burn-in apparatus in which semiconductor devices are held on burn-in boards for electrical connection not by means of sockets but through air suction.

2. Description of the Related Art

When semiconductor devices have been assembled, they are left to stand under severe conditions of high temperature and high voltage, usually for 10 to 40 hours, with a view to revealing any defects that would have caused an early failure. Subsequently, the semiconductor devices are subjected to a burn-in test, i.e., an accelerated test, in which their quality is judged by examining them for certain electrical properties, etc. Being conducted under severe conditions, the burn-in test simulates operating the semiconductor devices for a long period, for example, for several months, under real use conditions. Thus, any defects of the semiconductor devices that would have caused an early failure can be revealed through this test. Since this test takes a long time, a large number of semiconductor devices are subjected to it at one time.

FIG. 1 is a perspective view showing the outward appearance of a conventional burn-in apparatus. (Since an embodiment of the present invention has the same outward appearance as this one, FIG. 1 will also be referred to when describing the present invention.) FIG. 2 is a perspective view of a zone frame provided in the burn-in apparatus shown in FIG. 1, and FIG. 3 is a front view of this zone frame. The inner space of the burn-in apparatus, 1, which is opened by a door 1a, is divided into two sections by a side plate 2a. One of these sections is formed as a chamber 2. Provided on the side plate 2a are a heater, a blower, and so on (not shown) which keep the temperature in the chamber 2 constant. Basically, the same air pressure and the same atmosphere (air) are maintained in the chamber 2 as in the exterior. Arranged in the chamber 2 is a zone frame 3 on which board guides 4 are mounted. These board guides 4 support burn-in boards to which semiconductor devices to be subjected to a burn-in test are attached. Provided on the back wall of the chamber 2 are connectors 5 which are electrically connected to the semiconductor devices attached to the burn-in boards. One connector 5 is provided for each pair of board guides 4.

FIG. 4 is a plan view of a conventional burn-in board, and FIG. 5 is a perspective view of a socket to be attached to this burn-in board.

A burn-in board 7 shown is to be set in the above-described conventional burn-in apparatus 1. Attached to the main surface 8 of the burn-in board 7 are a multitude of sockets 6, into which semiconductor devices (not shown) are inserted and in which they are fixed. When the burn-in board 7, thus equipped with semiconductor devices, has been inserted through the board guides 4, the burn-in apparatus 1 transmits an electrical signal through the associated connector 5 to the semiconductor devices. In this condition, the inner space of the chamber 2 is set to a desired temperature. Thus, the burn-in test is conducted under conditions of high temperature and high voltage.

The problem with the burn-in apparatus 1 described above is that it requires a lot of sockets 6, as shown in FIG. 4. The cost of these sockets is rather high compared with the cost of the burn-in board 7.

In addition, the leads of semiconductor devices may be bent when inserting them into or extracting them from the sockets 6.

SUMMARY OF THE INVENTION

This invention has been made to eliminate the above problems. It is accordingly the object of this invention to provide a burn-in apparatus in which the burn-in test is conducted with semiconductor devices being fixed to the burn-in boards without using any sockets.

In accordance with this invention, there is provided a burn-in apparatus comprising: a holding means for holding semiconductor devices through air suction; an electrical/connection means for electrically connecting the semiconductor devices to external equipment; a burn-in board equipped with a hollow section communicating with the holding means and a suction port through which air is evacuated from the hollow section; a chamber for accommodating the burn-in board; and an evacuation means for evacuating air from the hollow section through the suction port.

BRIEF DESCRIPTION OF THE DRAWINGS

FIG. 1 is a perspective view of a burn-in apparatus in accordance with an embodiment of this invention or of a conventional burn-in apparatus;

FIGS. 2 and 3 are a perspective view and a front view, respectively, of the zone frame provided in the chamber of the conventional burn-in apparatus shown in FIG. 1;

DETAILED DESCRIPTION OF THE PREFERRED EMBODIMENTS

Figure 3:
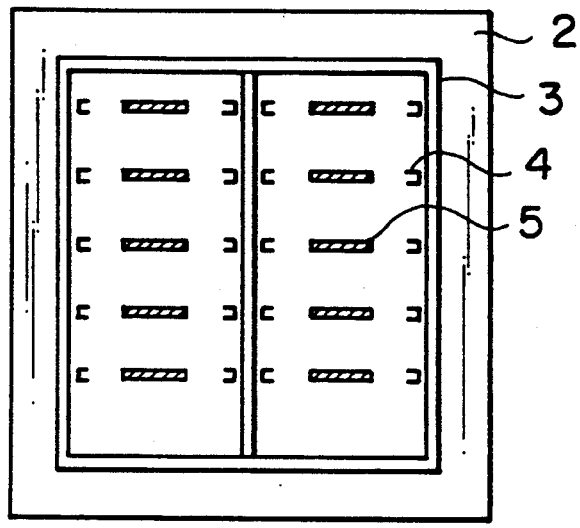
Figure 5:
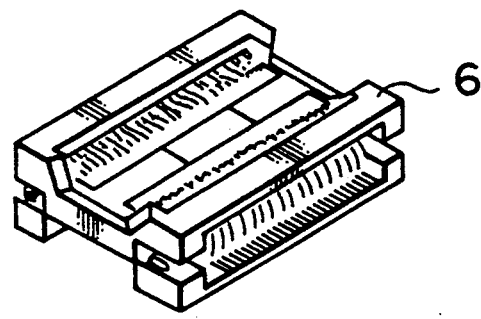
FIG. 5 is a perspective view of a socket to be attached to the burn-in board shown in FIG. 4.
Figure 4:
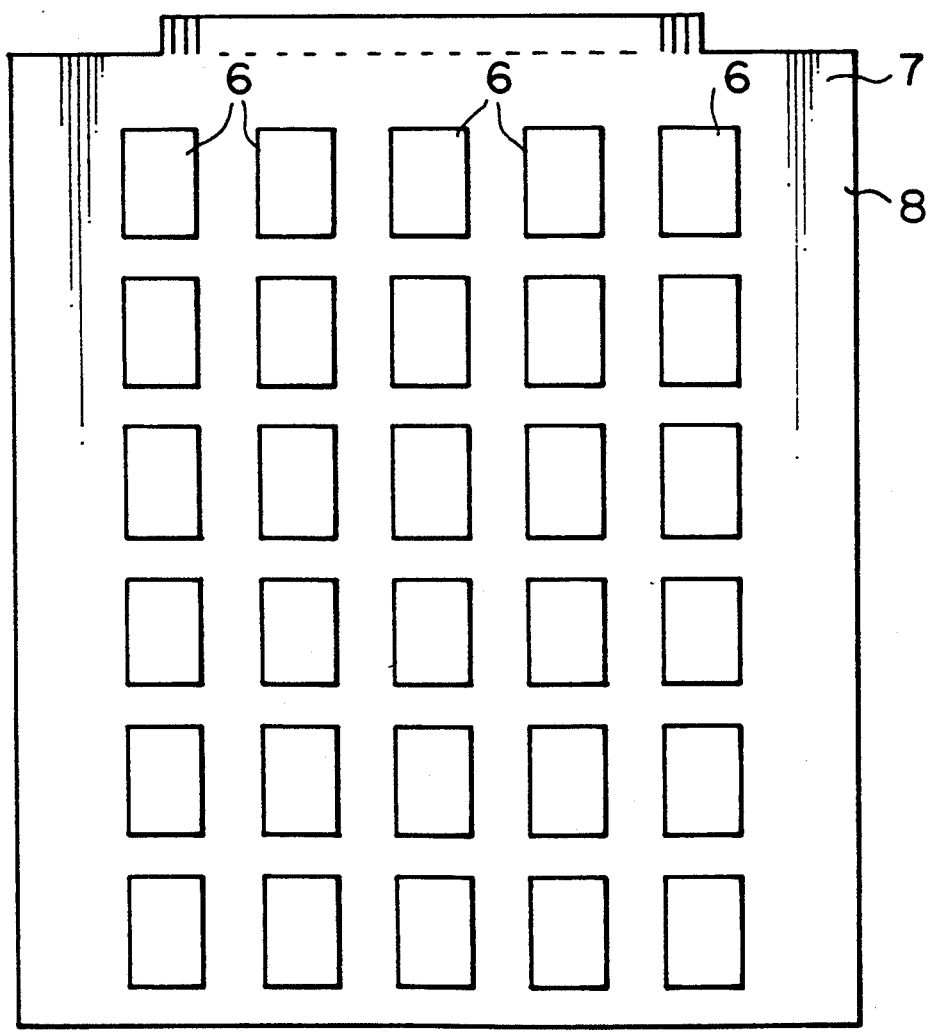
FIG. 4 is a plan view of a conventional burn-in board.
Figure 6:
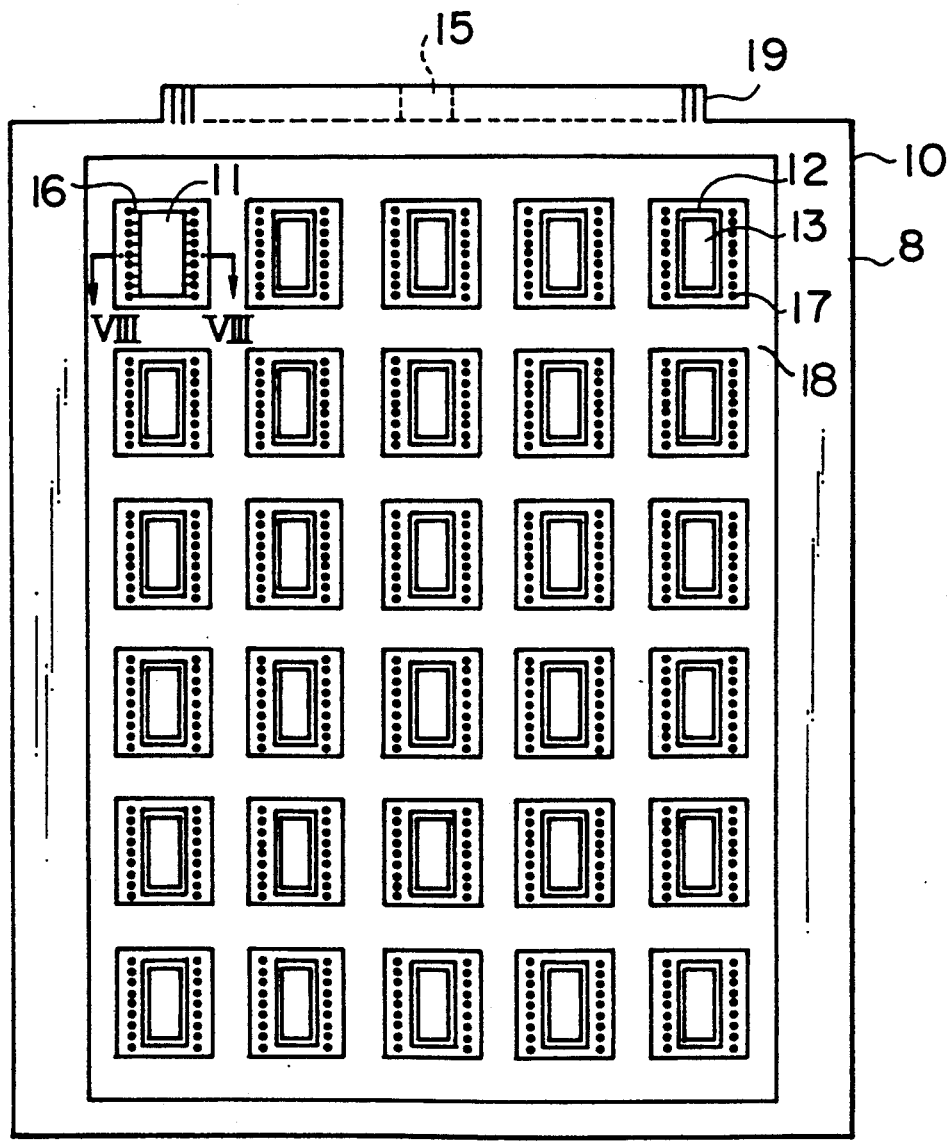
FIG. 6 is a plan view of a burn-in board used in a burn-in apparatus in accordance with an embodiment of this invention.
Figure 7:
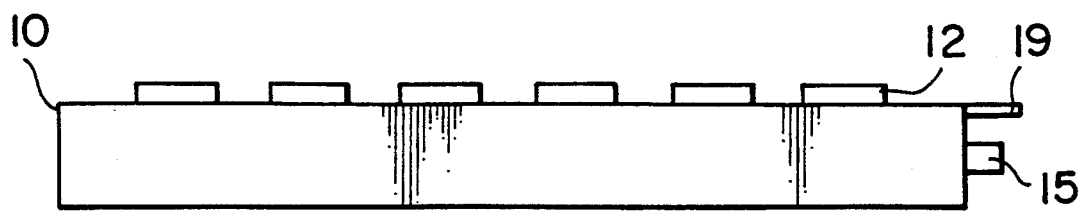
FIG. 7 is a side view of the burn-in board shown in FIG. 6.
Figure 8:
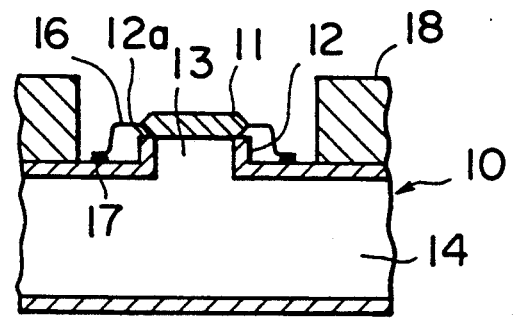
FIG. 8 is a sectional view taken along the line VIII—VIII of FIG. 6.

Embodiments of this invention will now be described with reference to FIGS. 6 to 15. As shown in FIGS. 6 to 8, the burn-in board 10 of this invention has on its main surface 8 a multitude of protrusions 12 for holding semiconductor devices, for example, SOP-type semiconductor devices, through air suction. Each of these protrusions 12 consists of a semiconductor-device holding section 12a which is equipped with a suction hole 13 communicating with a suction path 14 in the form of a hollow section formed in the burn-in board 10 having at one end a suction port 15. The air in the suction path 14 is evacuated through the suction port 15, thereby holding the semiconductor devices 11 on the respective protrusions 12. By properly adjusting the height of these protrusions 12, the leads 16 of the semiconductor devices 11 can be kept in contact with conductor 17. The semiconductor devices 11 are held in position before applying the vacuum by means of a lattice-like partition member 18, which is omitted in FIG. 7. The suction port 15 is provided below an electrode member 19 which connects the burn-in board 10 to an exterior circuit (not shown). A plurality of such burn-in boards 10 are accommodated in the chamber 2 of the burn-in apparatus 1A of this invention.

Figure 9:
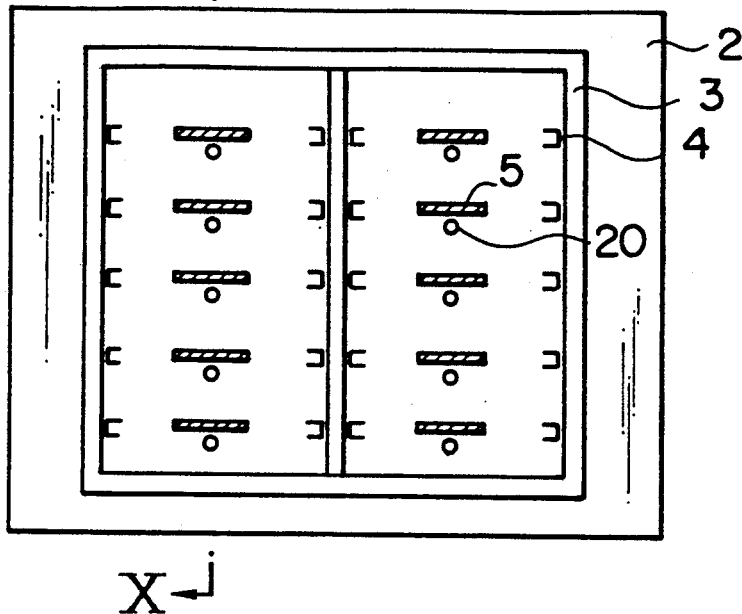
FIG. 9 is a front view of the zone frame disposed in the burn-in apparatus of this invention.
Figure 10:
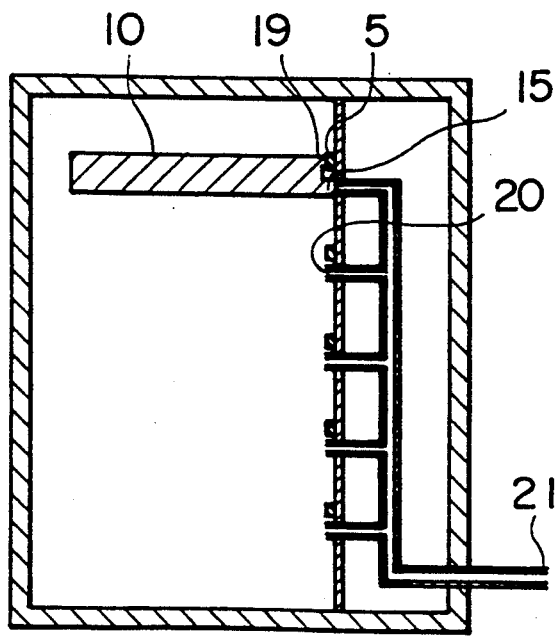
FIG. 10 is a sectional view taken along the line X—X of FIG. 9.

FIG. 9 is a front view of a zone frame arranged in the chamber of the burn-in apparatus of this invention. FIG. 10 is a schematic sectional view taken along the line X—X of FIG. 9. In these drawings, each burn-in board 10 is supported by a pair of board guides 4, the electrode member 19 thereof being inserted into one of the connectors 5 provided on the back wall of the chamber 2. Attachment holes 20 are also provided on the back wall of the chamber 2. The suction port 15 of each burn-in board 10 is inserted into one of these attachment holes 20, which are connected to an evacuation means such as a vacuum pump (not shown) through a vacuum pipe 21.

With the burn-in apparatus 1A thus constructed, semiconductor devices 11 are set on each burn-in board 10 with their leads 16 in contact with the respective conductors 17. When all the protrusions 12 of the board have been equipped with semiconductor devices 11, the burn-in board 10 is put in the chamber 2. Its electrode member 19 is then connected to one of the connectors 5, and, at the same time, its suction port 15 is inserted into one of the attachment holes 20. Next, the vacuum pump (not shown), which is connected to the vacuum pipe 21 is operated, thereby evacuating air from the suction path 14 of the burn-in board 10. As a result of the above operations, the semiconductor devices 11 placed on the protrusions 12 of the burn-in board 10 are held to the board while being electrically connected to the conductors 17. Accordingly, the sockets 6 of the conventional burn-in apparatus are not necessary in this apparatus, which results in a reduction in cost. Furthermore, the leads 16 are prevented from being bent. In addition, the operation of inserting the semiconductor devices into and extracting them from the sockets 6 is replaced by the operation of placing them on the holding means on the board, resulting in a simplified operation. Further, by making the protrusions 12 of an elastic material, the leads 16 of the semiconductor devices 11 can be reliably kept in contact with the conductors 17 even if there is some variation in lead length.

Figure 11:
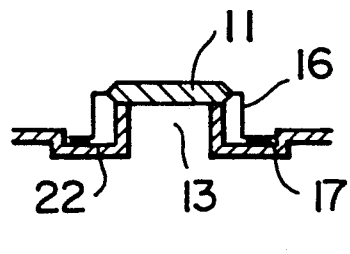
FIGS. 11, 12 and 16 are sectional views showing other embodiments of means for holding semiconductor devices on a burn-in board.
Figure 12:
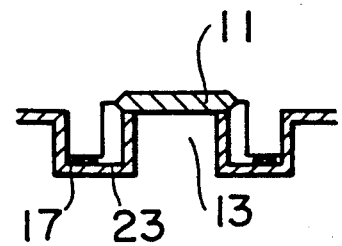

While in the above-described embodiment the semiconductor devices 11 are positioned and held on the burn-in board by means of the partition member 18 and the protrusions 12, it is also possible, as shown in FIG. 11, to form the board sections at the conductors 17 as recesses 22 the number of which is the same as that of the leads 16. In that case, the partition member 18 is not be necessary. Further, as shown in FIG. 12, such recesses may have a depth corresponding to the length of the leads 16. With this structure, the partition 18 are not necessary either.

Figure 13:
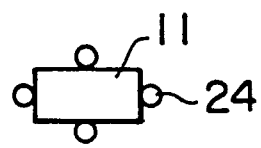
FIG. 13 is a plan view showing another embodiment of the members for positioning semiconductor devices on a burn-in board.
Figure 14:
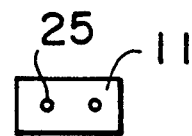
FIGS. 14 and 15 are rear views of other embodiments of the suction holes of the burn-in board.
Figure 15:
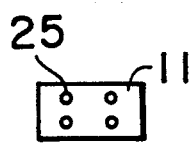
Figure 16:

Further, while in the above-described embodiment the partition member 18 has a lattice-like configuration, bar-like positioning members 24 as shown in FIG. 13 may also occupy the entire upper area of the protrusions 12. Instead of a single suction hole, a plurality of smaller suction holes 25 may be provided in each protrusion 12, as shown in FIGS. 14 and 15. This arrangement makes it possible to effect the air suction more reliably. The semiconductor devices to which this invention is to be applied are not restricted to the SOP-type. They may also be of the PLCC-type, SOJ-type, and so on; this invention can be applied to all sorts of semiconductor devices of the surface-mounting type, as shown in FIG. 16. While in the above-described embodiment the suction port 15 is arranged below the electrode member 19, it may also be arranged at some other position, for example, beside the electrode member so that the burn-in board 10 can be made thinner. Further, the burn-in apparatus 1A of this invention can also be applied to a final test in which the electrical properties of semiconductor devices are measured at room temperature or a higher temperature, for example, 80° C.

What is claimed is:

1. A burn-in test method comprising:
   placing a plurality of semiconductor devices having bodies and extending leads over respective openings in a hollow burn-in board so that the bodies are peripherally supported by the board;
   holding the semiconductor devices in place over the respective openings by evacuating the hollow burn-in board, thereby electrically connecting the semiconductor devices to electrical conductors disposed on the burn-in board; and
   simultaneously subjecting the semiconductor devices to predetermined environmental conditions and performing electrical tests on the semiconductor devices through the conductors to examine characteristics of the semiconductor devices.

2. A burn-in apparatus comprising:
   a hollow burn-in board including a hollow interior, holding means for holding a plurality of individual semiconductor devices having respective bodies from which leads extend, a plurality of conductors disposed on said board for making electrical connections to the leads of semiconductor devices held by said holding means, and a suction port communicating with the hollow interior wherein said holding means comprises a plurality of openings in the burn-in board defined by respective peripheries communicating with the hollow interior, the burn-in board supporting the body of a respective semiconductor device at the periphery adjacent each opening, and said conductors are disposed adjacent the openings;
   electrical connection means for electrically connecting the conductors to external equipment;
   a chamber for receiving said burn-in board; and
   evacuation means for evacuating the interior of the hollow burn-in board received in said chamber through said suction port.

3. An apparatus as claimed in claim 2 wherein said holding means comprises a protrusion disposed on said burn-in board adjacent each of said openings.

4. An apparatus as claimed in claim 3 wherein each of said protrusions is an elastic material.

5. An apparatus as claimed in claim 2 including partitions extending outwardly from said burn-in board proximate the openings, forming recesses between said protrusions and said partitions for receiving leads of semiconductor devices held by said holding means, said conductors being disposed in said recesses.

6. An apparatus as claimed in claim 5 wherein said partitions form a lattice on said burn-in board.

7. An apparatus as claimed in claim 2 wherein said semiconductor devices are of the surface-mounting type.

* * * * *